United States Patent
Jasklowski (10) Patent No.: US 10,822,995 B2
(45) Date of Patent: Nov. 3, 2020

(54) FLEXIBLE BAND ELECTRICAL COMPONENT MOUNTS AND METHODS

(71) Applicant: The Boeing Company, Chicago, IL (US)

(72) Inventor: Chris T. Jasklowski, Redmond, WA (US)

(73) Assignee: The Boeing Company, Chicago, IL (US)

( * ) Notice: Subject to any disclaimer, the term of this patent is extended or adjusted under 35 U.S.C. 154(b) by 593 days.

(21) Appl. No.: 15/408,190

(22) Filed: Jan. 17, 2017

(65) Prior Publication Data

US 2018/0202313 A1 Jul. 19, 2018

(51) Int. Cl.
| | |
|---|---|
| *F01D 21/00* | (2006.01) |
| *H05K 7/12* | (2006.01) |
| *F01D 25/24* | (2006.01) |
| *B64D 29/00* | (2006.01) |
| *F01D 17/02* | (2006.01) |
| *F01D 25/28* | (2006.01) |

(52) U.S. Cl.
CPC .......... *F01D 21/003* (2013.01); *B64D 29/00* (2013.01); *F01D 17/02* (2013.01); *F01D 25/24* (2013.01); *F01D 25/28* (2013.01); *H05K 7/12* (2013.01); *F05D 2220/323* (2013.01); *F05D 2260/83* (2013.01)

(58) Field of Classification Search
CPC ........ F01D 21/003; F01D 17/02; B64D 29/00
See application file for complete search history.

(56) References Cited

U.S. PATENT DOCUMENTS

| | | | |
|---|---|---|---|
| 4,991,431 A | 2/1991 | Gaither | |
| 5,664,810 A * | 9/1997 | Zielinski | A62C 3/16 285/136.1 |
| 8,302,465 B2 | 11/2012 | Johnson et al. | |
| 2010/0095525 A1* | 4/2010 | Shaw | B23P 6/002 29/888.021 |
| 2013/0160461 A1* | 6/2013 | Broughton | F02C 7/12 60/796 |
| 2013/0161093 A1 | 6/2013 | Broughton et al. | |
| 2013/0294900 A1 | 11/2013 | Graily et al. | |
| 2014/0161151 A1* | 6/2014 | Proctor | G01K 1/143 374/147 |
| 2014/0334517 A1* | 11/2014 | Blundell | G01K 1/143 374/44 |
| 2015/0098810 A1* | 4/2015 | Soria | F01D 25/28 415/200 |

FOREIGN PATENT DOCUMENTS

| | | | |
|---|---|---|---|
| CN | 204301890 U | * | 4/2015 |
| EP | 2708703 | | 3/2014 |

* cited by examiner

*Primary Examiner* — Charles G Freay
*Assistant Examiner* — Thomas Fink
(74) *Attorney, Agent, or Firm* — Haynes and Boone, LLP (57) ABSTRACT

Systems and methods are provided for a flexible band electrical component mount that includes a flexible band configured to receive one or more electrical components. The flexible band may be configured to couple to and/or wrap around at least a portion of an aircraft propulsor. The electrical components may be configured to output data from the aircraft propulsor and/or data related to operation of the aircraft propulsor. Such flexible bands may be configured to receive a plurality of electrical components and may be configured to wrap around the portion of the aircraft propulsor a plurality of times.

16 Claims, 6 Drawing Sheets

FLEXIBLE BAND ELECTRICAL COMPONENT MOUNTS AND METHODS

TECHNICAL FIELD

The disclosure relates generally to aircraft and more specifically to instrumentation mounting for aircraft propulsor testing.

BACKGROUND

Instrumentation is needed for monitoring of aircraft propulsor conditions during operation and/or during testing. When a plurality of instruments are required, as on all modern aircraft propulsors, such instrumentation is generally mounted as small clusters on individual brackets. Such individual brackets are generally mounted on inlet bulkheads. However, space on inlet bulkheads of aircraft propulsors is generally limited and accordingly limit the amount of instruments that can be used at any one time.

SUMMARY

Systems and methods are disclosed for aircraft propulsor test systems that may include a flexible band electrical component mount. In certain examples, the flexible band electrical component mount may include a flexible band including at least one electrical component opening, where the electrical component opening is configured to receive an electrical component configured to determine a parameter associated with an aircraft propulsor, and where the flexible band is configured to surround at least a portion of the aircraft propulsor, and a band coupler configured to couple together at least two portions of the flexible band.

In certain additional examples, an aircraft propulsor may be disclosed. The aircraft propulsor may include an engine, a plurality of electrical components configured to determine a parameter associated with the engine, a flexible band including a at least one electrical component opening, where the electrical component opening is configured to receive one or more of the electrical components, and where the flexible band is configured to surround at least a portion of the engine, a band coupler configured to couple together at least two portions of the flexible band, and a nacelle configured to surround the engine and the flexible band.

In certain other examples, a method may be disclosed. The method may include disposing an electrical components configured to determine a parameter associated with an aircraft propulsor within an electrical component opening of a flexible band, surrounding at least a portion of the aircraft propulsor with the flexible band, and coupling together at least two portions of the flexible band.

The scope of the invention is defined by the claims, which are incorporated into this section by reference. A more complete understanding of the disclosure will be afforded to those skilled in the art, as well as a realization of additional advantages thereof, by a consideration of the following detailed description of one or more implementations. Reference will be made to the appended sheets of drawings that will first be described briefly.

BRIEF DESCRIPTION OF THE DRAWINGS

Examples of the disclosure and their advantages are best understood by referring to the detailed description that follows. It should be appreciated that like reference numerals are used to identify like elements illustrated in one or more of the figures.

DETAILED DESCRIPTION

Flexible band electrical component mounts are described in the disclosure herein in accordance with one or more embodiments. The flexible band electrical component mount may allow instruments to be coupled to an aircraft propulsor. In certain examples, the flexible band electrical component mount may be configured to mount a high number of instruments (e.g., 50 or more instruments). The flexible band electrical component mount may include a flexible band that includes one or more electrical component openings, the electrical component opening configured to receive an electrical component (e.g., an instrument). The flexible band may be configured to wrap around a portion of the aircraft propulsor and may include a coupler to couple together at least two portions of the flexible band to hold the flexible band around the portion of the aircraft propulsor.

Figure 1:
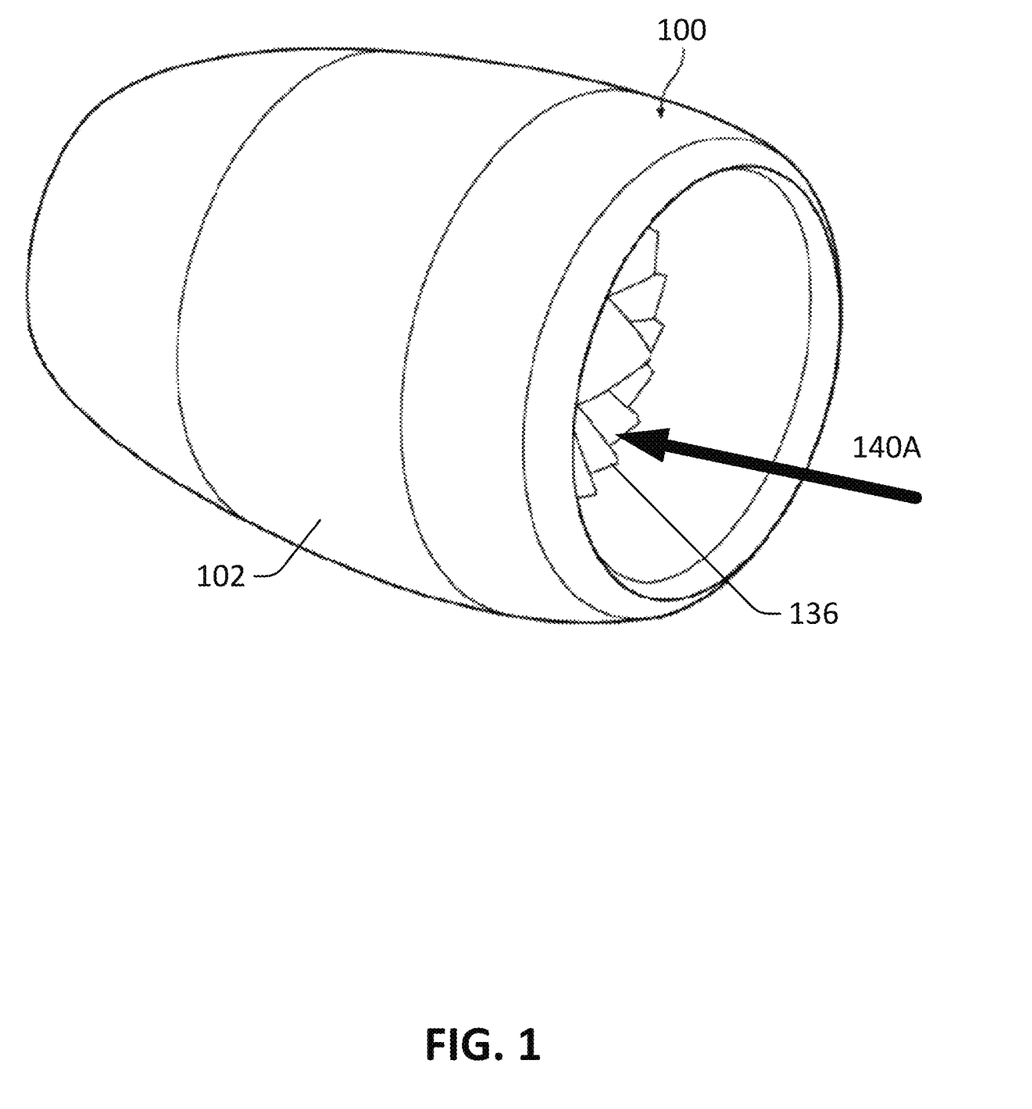
FIG. 1 illustrates a perspective view of an aircraft propulsor in accordance with an example of the disclosure.

FIG. 1 illustrates a perspective view of an aircraft propulsor in accordance with an example of the disclosure. Aircraft propulsor 100 includes a nacelle 102 and a fan 136. In the example shown in FIG. 1, the nacelle 102 contains the fan 136 and other components of the aircraft propulsor 100 used to produce trust, but other examples of the aircraft propulsor may arrange the fan so that the fan is not contained by the nacelle (e.g., in, for example, a turboprop configuration). The nacelle 102 may also include one or more portions that may be moved and/or removed to allow a technician or other personnel to access internal components of the aircraft propulsor 100 to, for example, insert and/or mount one or more electrical components (e.g., instruments) for monitoring one or more conditions of the aircraft propulsor 100.

The fan 136 intakes and/or energizes air flowing into the nacelle 102, such as in an airflow direction 140A. Air that flows into the nacelle 102 via airflow direction 140A may flow through various internal flow paths within the nacelle 102.

Figure 2:
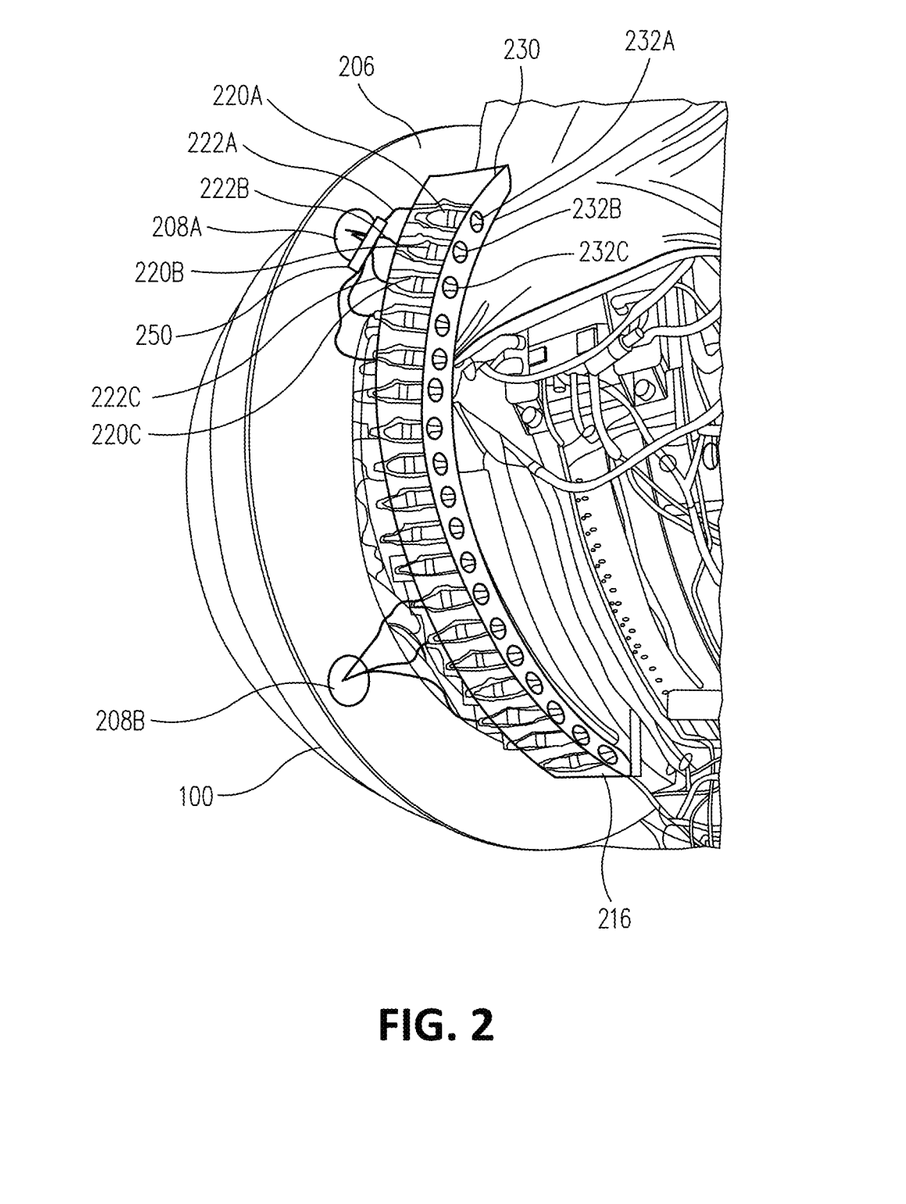
FIG. 2 illustrates a perspective view of an example of a flexible band electrical component mount in accordance with an example of the disclosure.

FIG. 2 illustrates a perspective view of an example of a flexible band electrical component mount in accordance with an example of the disclosure. The aircraft propulsor 100 shown in FIG. 2 includes a bulkhead 206. The bulkhead 206 includes pass-throughs 208A and 208B. FIG. 2 shows the aircraft propulsor 100 with one or more portions of the nacelle 102 removed to allow mounting, removal, and/or access to electrical components coupled to the aircraft propulsor 100 via flexible band electrical component mount 216.

The flexible band electrical component mount 216 includes a flexible band 230 with one or more electrical component openings, such as electrical component openings 232A-C. The flexible band 230 may be sized and/or configured to surround at least a portion of the aircraft propulsor 100. For example, the flexible band 230 may be configured to wrap around a perimeter of a core engine of the aircraft propulsor 100 (e.g., a portion of the aircraft propulsor 100 normally covered by a nacelle).

The flexible band 230 includes one or more electrical component openings such as electrical component openings 232A-C as well as other electrical component openings. Each of the electrical component openings 232A-C may be configured to receive one or more electrical components. For example, each of the electrical components 220A-C may be disposed within one of the electrical component openings 232A-C. Each of the electrical component openings 232A-C may, for example, be a cavity within the flexible band 230 configured to receive the one or more electrical components. In certain examples, the electrical component openings 232A-C may be flexible and may allow for insertion of an electrical component into the electrical component opening. After the electrical component has been inserted, the electrical component opening may then hold the electrical component within the electrical component opening. In certain such examples, the electrical component openings 232A-C may be sized smaller than the electrical component that the openings are configured to receive (e.g., the inner diameters of the electrical component openings 232A-C are smaller than the outer diameters of the electrical components 220A-C) and the electrical components 220A-C may deform the electrical component openings 232A-C when inserted. Such deformation may then hold the electrical components 220A-C in place after insertion.

The electrical components 220A-C may be any electrical component. In certain examples, the electrical components 220A-C may be configured to determine a parameter of the aircraft propulsor 100. As such, electrical components 220A-C may be, for example, transducers such as accelerometers (e.g., load cells, air flow sensors, potentiometers, and other transducers) as well as gyroscopes and/or other such sensors.

Certain testing applications may require a plurality of electrical components. As aircraft propulsors become more complicated and as data acquisition technology advances, the amount of electrical components required to acquire data associated with the aircraft propulsor may increase. As such, techniques such as mounting brackets for electrical components on the bulkhead of the aircraft propulsor may not allow for enough electrical components to be mounted to fully monitor and/or acquire the needed data for modern aircraft propulsor data acquisition techniques.

By contrast, the flexible band 216 may be configured to hold a greater number of electrical components than other techniques. Also, the flexible band 216 may be configured to wrap around itself one or more times and, thus, allow for a longer flexible band 216 with a greater number of electrical component openings, further increasing the number of electrical components that may be carried by the flexible band 216. Accordingly, the flexible band electrical component mount may allow for a larger number of electrical components to be mounted.

In certain examples, such as during testing of aircraft propulsors, the nacelle or a portion of the nacelle may be removed and the testing procedure may be performed with the portion of the nacelle removed. With the nacelle removed, the flexible band 216 may wrap around itself a larger amount of times than with the nacelle installed, and thus may be longer and allow for an even greater number of electrical components to be installed.

Referring back to FIG. 2, the electrical components 220A-C includes wires 222A-C, respectively. The wires 222A-C are routed through the pass-through 208A. In certain examples, the wires 222A-C are coupled together by wire organizer 250. The wire organizer 250 may couple together the wires 222A-C, as well as other wires, to couple the wires together as one large bundle that may then be routed through the pass-through 208A.

Figure 3:
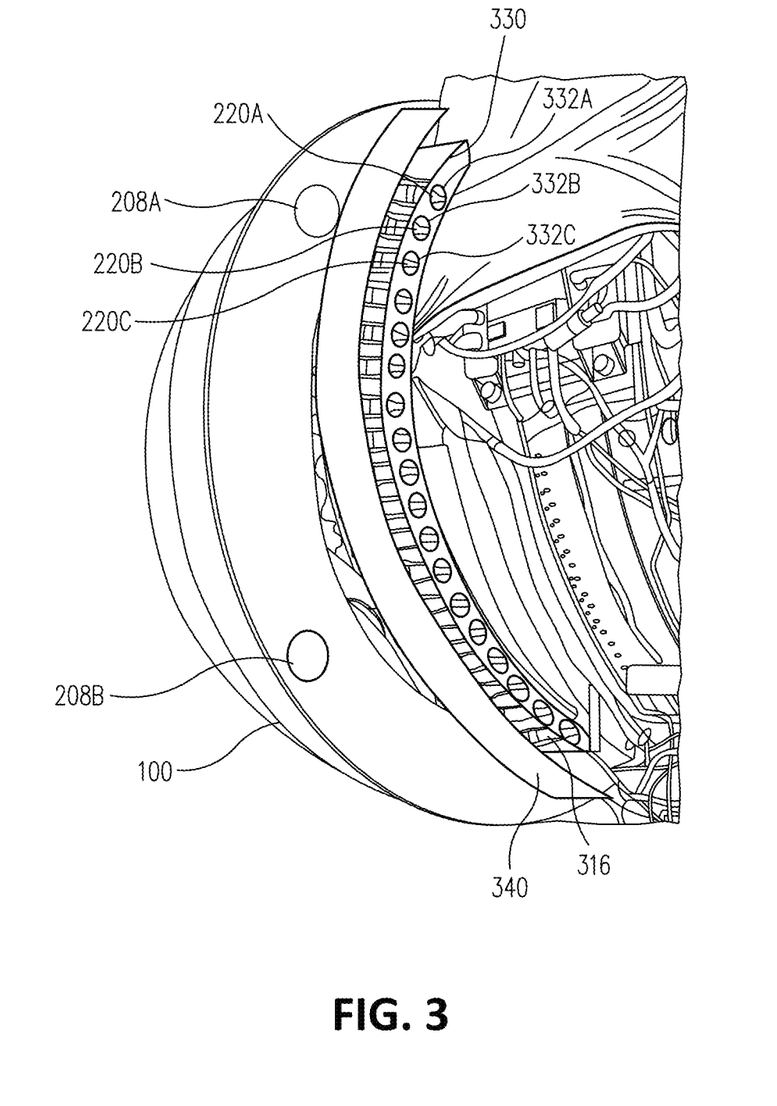
FIG. 3 illustrates a perspective view of another example of a flexible band electrical component mount in accordance with an example of the disclosure.

FIG. 3 illustrates a perspective view of another example of a flexible band electrical component mount in accordance with an example of the disclosure. The aircraft propulsor 100 shown in FIG. 3 also include a bulkhead 206 that includes pass-throughs 208A and 208B. Additionally, FIG. 2 illustrates a flexible band electrical component mount 316 that includes a flexible band 330 with one or more electrical component openings (e.g., electrical component openings 332A-C) configured to hold one or more electrical components (e.g., electrical components 220A-B).

The flexible band 230 is held against at least a portion of the aircraft propulsor 100 via a strap 340. The strap 340 may be, for example, an elastic strap that may wrap around a portion of the flexible band 330 (e.g., an outer perimeter of the flexible band 330). The strap 340 may be elastic and/or may be configured to wrap around the flexible band 330 so that the flexible band 330 is at least partially deformed to securely hold the flexible band 330 against the aircraft propulsor 100. In certain examples, the strap 340 may be a continuous loop that is stretched over the aircraft propulsor 100 to secure the flexible band 330 against the aircraft propulsor 100. In other examples, the strap 340 may include a first strap end and a second strap end and the first strap end and the second strap end may be secured to each other after wrapping the strap 340 around the flexible band 330 to hold the flexible band 330 against the aircraft propulsor 100.

Figure 4:
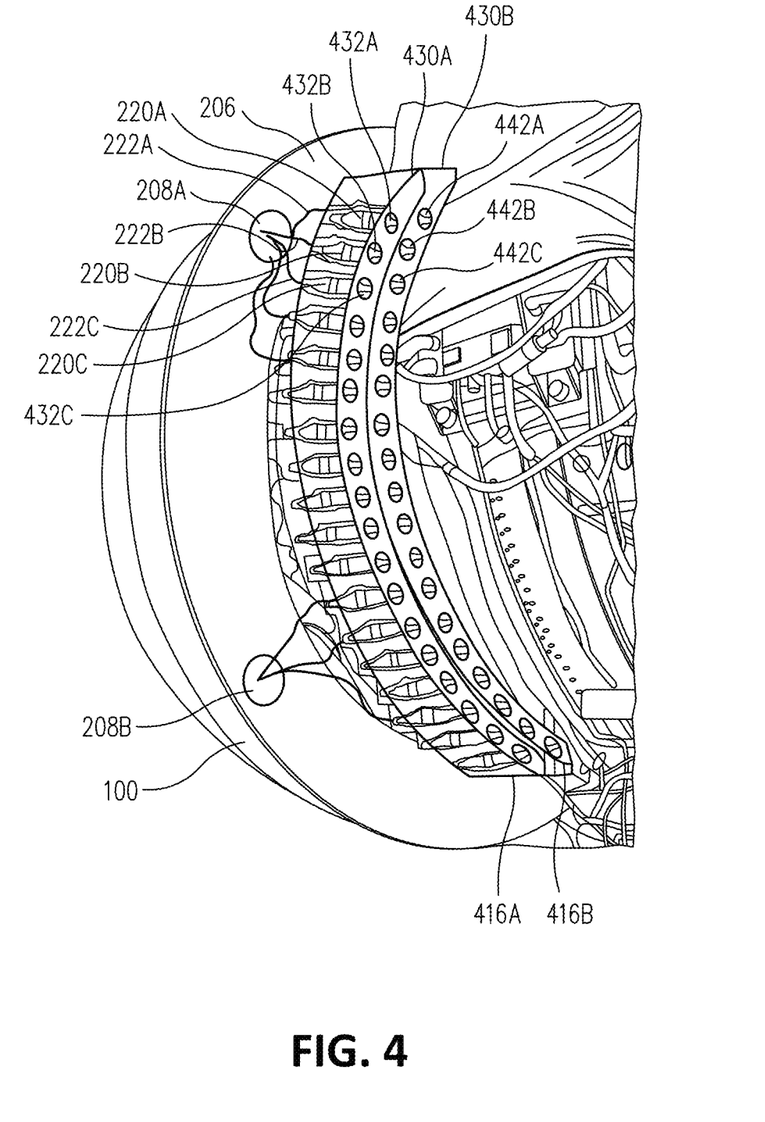
FIG. 4 illustrates a perspective view of a further example of a flexible band electrical component mount in accordance with the disclosure.

FIG. 4 illustrates a perspective view of a further example of a flexible band electrical component mount in accordance with the disclosure. The aircraft propulsor 100 shown in FIG. 4 also includes a bulkhead 206 that includes pass-throughs 208A and 208B. FIG. 4 illustrates flexible band electrical component mounts 416A and 416B that includes flexible bands 430A and 430B, respectively, each with one or more electrical component openings (e.g., electrical component openings 432A-C and 442A-C) configured to hold one or more electrical components.

As illustrated in FIG. 4, the flexible band 430A of the electrical component mount 416A overlaps the flexible band 430B of the electrical component mount 416B. In certain examples, the flexible band 430A and 430B may be the same flexible band (e.g., flexible band 430A may be a first portion and flexible band 430B may be a second portion of the same flexible band and such a flexible band may wrap around itself so that, for example, flexible band 430B is wrapped around the outside of the flexible band 430A), may be connected (e.g., the flexible band 430 may be connected to the flexible band 430A via one or more fasteners and may be wrapped around the outside of the flexible band 430A), and/or may be separate flexible bands (e.g., the flexible bands 430A and 430B may be separate flexible bands and the flexible band 430B may be wrapped around the outside of the flexible band 430A and, thus, flexible band 430B may be of a larger diameter than flexible band 430A). Whether the flexible band 430A and 430B are the same band, connected, or different bands, they may be wrapped a plurality of times around itself, around one or another of the flexible bands 430A and/or 430B, and/or another such flexible band. Accordingly, the flexible bands may be "layered" as needed to hold the required number of electrical components.

In certain additional examples, the flexible bands 430A and 430B may be held in place via a variety of techniques. For example, the flexible band 430B may include a first end and a second end and may be configured to wrap around the flexible band 430A. The first end and the second end may then be connected to each other and, when connected, may hold both the flexible band 430A and the flexible band 430B against a portion of the aircraft propulsor 100 (e.g., the core engine of the aircraft propulsor 100). Certain other such examples may include a strap that may wrap around the flexible band 430A and/or 430B to hold the flexible band 430A and/or 430B in place.

In other examples, the flexible band 430A and 430B may be connected and/or may be the same flexible band. A first portion of the flexible band 430A and/or 430B may be coupled to a second portion of the flexible band 430A and/or 430B. When coupled together, the flexible band 430A and/or 430B may positioned such that the flexible band 430A and/or 430B may be held against a portion of the aircraft propulsor 100 (e.g., the core engine of the aircraft propulsor 100). In certain examples, the flexible band 430A and/or 430B may be held in a manner that prevents the flexible band 430A and/or 430B from decoupling from the portion of the aircraft propulsor 100. For example, the flexible band 430A and/or 430B may fully wrap around the portion of the aircraft propulsor 100 and, thus, not be removed from the portion of the aircraft propulsor 100 unless the first portion is decoupled from the second portion.

Figure 5:
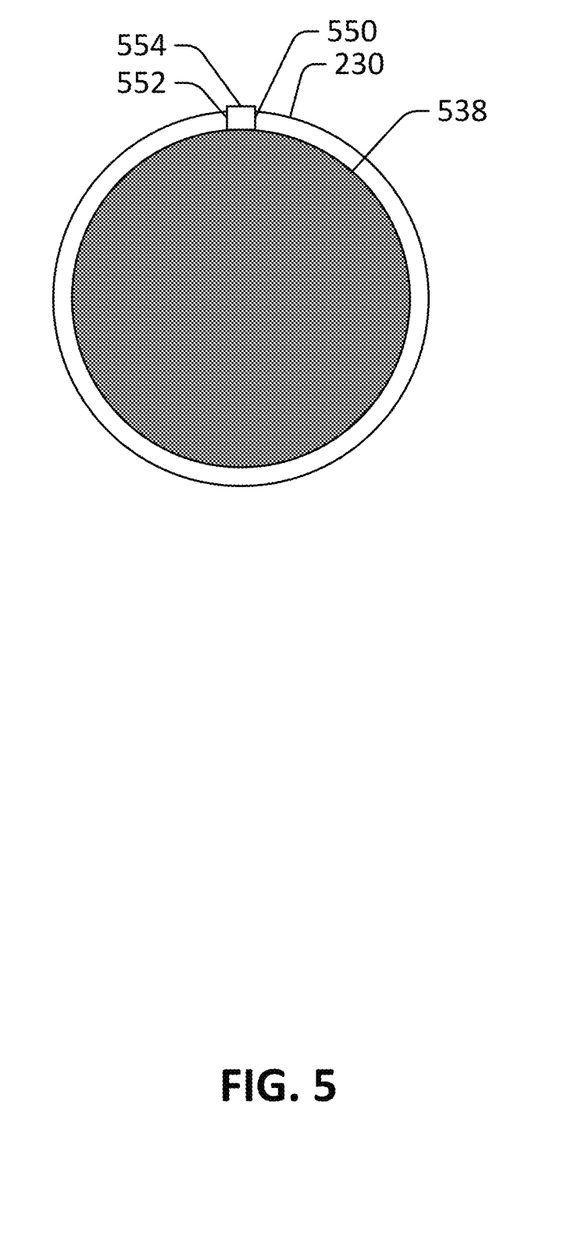
FIG. 5 illustrates a cutaway view of an aircraft propulsor with a flexible band electrical component mount in accordance with the disclosure.

FIG. 5 illustrates a cutaway view of an aircraft propulsor with a flexible band electrical component mount in accordance with the disclosure. FIG. 5 illustrates a core engine 538 of an aircraft propulsor with a flexible band 230. FIG. 5 illustrates an example of coupling together the flexible band 230 so that it wraps around the core engine 538.

In FIG. 5, the flexible band 230 is coupled to (e.g., wrapped around) the core engine 538. The flexible band 230 includes a first end 550 and a second end 552. The first end 550 and the second end 552 may be coupled together via the coupler 554. As such, when the first end 550 is coupled to the second end 552 via the coupler 554, the flexible band 230 may be wrapped around the core engine 538. In certain examples, the flexible band 230 may wrap around the core engine 538 a plurality of times and, thus, one portion of the flexible band 230 may overlap another portion of the flexible band 230.

The coupler 554 may be, for example, a mechanical coupler such as one or more snaps, hooks, hinges, connectors, fasteners, adhesives, Velcro straps, and/or other such couplers. Also, in certain other examples, the coupler 554 may be configured to couple together portions of two of more flexible bands.

Figure 6:
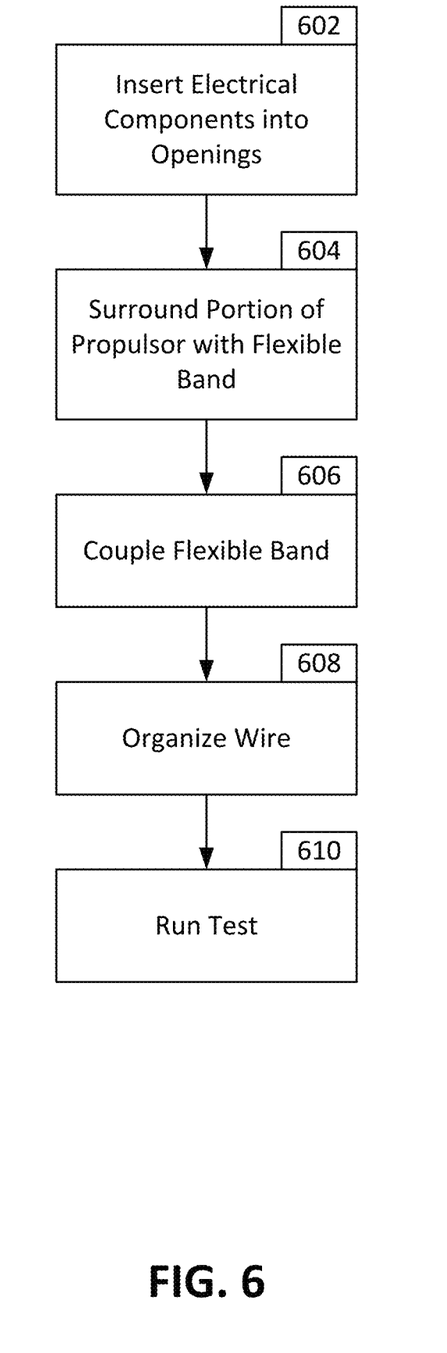
FIG. 6 is a flowchart detailing a technique for testing of aircraft propulsors with the flexible band electrical component mount in accordance with examples of the disclosure.

FIG. 6 is a flowchart detailing a technique for testing of aircraft propulsors with the flexible band electrical component mount in accordance with examples of the disclosure.

In block 602, electrical components are inserted into electrical component openings of a flexible band. In certain examples, each electrical component opening may be configured to receive one electrical component, but other examples may include one or more electrical component openings configured to receive more than one electrical component.

In block 604, the flexible band may be positioned around at least a portion of the aircraft propulsor. For example, the flexible band may be hung off of a portion of the aircraft propulsor and/or may be wrapped around the portion of the aircraft propulsor. Additionally, in certain examples, a plurality of flexible bands may be positioned around at least a portion of the aircraft propulsor. In certain examples, the plurality of flexible bands may wrap around each other, but in other examples, the flexible bands may wrap around different portions of the aircraft propulsor.

One portion of the flexible band may then be coupled to another portion of the flexible band in block 606. Coupling the portions of the flexible band together may hold the flexible band against the portion of the aircraft propulsor. In certain examples, the portions may be portions of the same flexible band, but in other examples, the portions may be portions of two or more different flexible bands. In certain other examples, a strap may be wrapped around the flexible band or plurality of flexible bands to hold the one or more bands around the portion of the aircraft propulsor.

In block 608, wires of the electrical components may be organized. As such, one or more wire organizers may be used to hold a plurality of wires to organize the wires. In certain examples, the wire organizers may hold the wires to aid in threading the wires through one or more pass-throughs located on a bulkhead of the aircraft propulsor. After the wires are organized, the electrical components may then electrically connect to one or more testing modules to, for example, deliver data to such testing modules. The testing modules may be located on the aircraft propulsor and/or may be remotely located and data may be delivered via, for example, one or more data connections.

In block 610, a test sequence may be performed using the one or more electrical components. During the test sequence, the aircraft propulsor may be operated and the one or more electrical components may output data. In certain examples, the data may be related to operation of the aircraft propulsor.

Examples described above illustrate but do not limit the invention. It should also be understood that numerous modifications and variations are possible in accordance with the principles of the present invention. Accordingly, the scope of the invention is defined only by the following claims.

What is claimed is:

1. An aircraft propulsor comprising:
   an engine;
   a plurality of electrical components configured to determine a parameter associated with engine operation during operation of the engine;
   a flexible band housing the plurality of electrical components, wherein the flexible band comprises a plurality of electrical component openings, wherein the plurality of electrical component openings are configured to receive respectively the plurality of electrical components, wherein the flexible band is disposed to couple to at least a portion of the engine and surround the portion of the engine a plurality of times such that the flexible band has a first layer disposed on the portion of the engine and a second layer disposed on the first layer, and wherein each of the first layer and the second layer has a respective non-empty subset of the plurality of electrical components;
   a band coupler disposed on the flexible band couples together at least two portions of the flexible band; and a nacelle disposed to surround the engine and the flexible band.

2. The aircraft propulsor of claim 1, further comprising a strap disposed on the flexible band to couple to the flexible band and hold the flexible band against the portion of the engine.

3. The aircraft propulsor of claim 1, further comprising a bulkhead coupled to the engine and comprising at least one pass-through, wherein at least one of the plurality of electrical components comprises a wire configured to route through the pass-through.

4. The aircraft propulsor of claim 3, wherein each of the plurality of electrical component openings is configured to receive a respective electrical component of the plurality of electrical components, wherein the aircraft propulsor further comprises a wire organizer configured to hold at least a plurality of wires coupled to the plurality of electrical components, and wherein each of the plurality of wires is configured to route through the pass-through.

5. The aircraft propulsor of claim 1, wherein an inner diameter of at least one of the plurality of electrical component openings is smaller than an outer diameter of at least one of the plurality of electrical components.

6. The aircraft propulsor of claim 1, wherein a first electrical component of the plurality of electrical components is an accelerometer, and wherein a second electrical component of the plurality of electrical components is a gyroscope.

7. A method of assembling the aircraft propulsor of claim 1, the method comprising:
disposing the plurality of electrical components respectively within the plurality of electrical component openings of the flexible band, wherein the plurality of electrical components are configured to determine the parameter associated with the engine operation;
surrounding at least the portion of the engine with the flexible band; and
coupling together at least two portions of the flexible band.

8. The method of claim 7, wherein a first electrical component of the plurality of electrical components is a transducer.

9. The method of claim 7, further comprising:
threading a plurality of wires through a pass-through of a bulkhead of the aircraft propulsor, wherein each of the plurality of wires is coupled to one of the plurality of electrical components.

10. The method of claim 9, further comprising:
coupling a wire organizer to a plurality of the wires to hold the plurality of wires.

11. The method of claim 7, further comprising:
coupling a strap to the flexible band to hold the flexible band against the portion of the engine of the aircraft propulsor.

12. An aircraft propulsor comprising:
an engine;
a plurality of electrical components configured to determine a parameter associated with engine operation during operation of the engine, wherein a first electrical component of the plurality of electrical components is an accelerometer, and wherein a second electrical component of the plurality of electrical components is a gyroscope;
a flexible band housing the plurality of electrical components, wherein the flexible band comprises a plurality of electrical component openings, wherein the plurality of electrical component openings are configured to receive respectively the plurality of electrical components, and wherein the flexible band is disposed to surround and couple to at least a portion of the engine;
a band coupler disposed on the flexible band couples together at least two portions of the flexible band; and
a nacelle disposed to surround the engine and the flexible band.

13. The aircraft propulsor of claim 12, further comprising a strap disposed on the flexible band to couple to the flexible band and hold the flexible band against the portion of the engine.

14. The aircraft propulsor of claim 12, further comprising a bulkhead coupled to the engine and comprising at least one pass-through, wherein at least one of the plurality of electrical components includes a wire configured to route through the pass-through.

15. The aircraft propulsor of claim 14, wherein each of the plurality of electrical component openings is configured to receive a respective electrical component of the plurality of electrical components, wherein the aircraft propulsor further comprises a wire organizer configured to hold at least a plurality of wires coupled to the plurality of electrical components, and wherein each of the plurality of wires is configured to route through the pass-through.

16. The aircraft propulsor of claim 12, wherein an inner diameter of at least one of the plurality of electrical component openings is smaller than an outer diameter of at least one of the plurality of electrical components.

* * * * *